US006002589A

United States Patent [19]
Perino et al.

[11] Patent Number: 6,002,589
[45] Date of Patent: Dec. 14, 1999

[54] INTEGRATED CIRCUIT PACKAGE FOR COUPLING TO A PRINTED CIRCUIT BOARD

[75] Inventors: Donald V. Perino, Los Altos; John B. Dillon, deceased, late of Palo Alto, both of Calif., by Nancy David Dillon, executor

[73] Assignee: Rambus Inc., Mountain View, Calif.

[21] Appl. No.: 08/897,784

[22] Filed: Jul. 21, 1997

[51] Int. Cl.[6] .............................. H05K 7/02; H05K 7/12; H05K 7/20; H05K 1/14
[52] U.S. Cl. ........................ 361/749; 361/719; 361/720; 361/786; 361/789; 439/67; 439/77
[58] Field of Search ..................... 174/254, 261; 257/688, 690, 695, 700, 706, 707, 711, 712, 713, 719, 723, 733, 735, 786; 361/760, 717, 718, 719, 720, 709, 707, 704, 772, 749, 774, 776, 779, 783, 784, 803, 789, 807, 809, 785, 786; 439/68, 61, 62, 65, 66, 67, 69, 77, 83, 86, 91, 331, 526, 541.5, 591, 636, 485, 326; 365/51, 52, 65; 396/542

[56] References Cited

U.S. PATENT DOCUMENTS

| 3,082,398 | 3/1963 | Valach . | |
|---|---|---|---|
| 3,114,587 | 12/1963 | Herrmann . | |
| 3,701,071 | 10/1972 | Landman . | |
| 3,874,768 | 4/1975 | Cutchaw . | |
| 4,426,689 | 1/1984 | Henle et al. ................................ | 365/52 |
| 4,586,764 | 5/1986 | Mullen, III et al. . | |
| 4,598,962 | 7/1986 | Reitz et al. ................................ | 439/59 |
| 4,636,022 | 1/1987 | Sonobe . | |
| 4,678,252 | 7/1987 | Moore . | |
| 4,714,435 | 12/1987 | Stipanuk et al. . | |

(List continued on next page.)

FOREIGN PATENT DOCUMENTS

| 0 472 203 | 2/1992 | European Pat. Off. . | |
|---|---|---|---|
| 0 542 433 | 5/1993 | European Pat. Off. . | |
| 2 109 444 | 5/1972 | France . | |
| 3 611 346 | 10/1987 | Germany . | |
| 55 138 264 | 10/1980 | Japan . | |
| 59-130453 | 7/1984 | Japan ..................................... | 257/733 |
| 59-312217 | 7/1984 | Japan . | |
| 1-166545 | 6/1989 | Japan . | |
| 10-150065 | 2/1998 | Japan . | |
| 9318559 | 9/1993 | WIPO . | |

(List continued on next page.)

OTHER PUBLICATIONS

European Search Report, 1 page.
"Chip To Package Interconnections", chapter from book: Optoelectronic Interconnections, pp. 436, 437 & 463.
Terry Cosslouc, Connector Combines Metal With Elastomers. 1 page.
IBM Technical Disclosure Bulletin "Inexpensive Chip Package" vol. 33 No. 1A pp.272 and 273, Jun. 1990.
Cook, R. "More Memory in Less Space", Byte Magazine, pp. 197, 198, 200 (Jun. 1995).
Brearley, Jr., D. "Assuming Reliability of Surface Mounted Connectors," National Electronic Packaging and Production Conference, pp. 606–614 (Feb. 25–27, 1986).
Brearley, Jr., D. "The Connector/PCB Interface Key to Success in Surface Mounting of Connectors,"N.E.P. and Production Conference, pp. 427–434 (Feb. 25–27 1986).

(List continued on next page.)

*Primary Examiner*—Donald Sparks
*Attorney, Agent, or Firm*—Blakely, Sokoloff, Taylor & Zafman LLP

[57] ABSTRACT

A method and apparatus for an integrated circuit package is provided. The integrated circuit package is designed for coupling an integrated circuit to a printed circuit board. The integrated circuit package includes a base having a bottom and a side. A flex circuit having traces therein is coupled to the base. The traces in the flex circuit are designed to couple to the leads of the integrated circuit. The traces further are designed to couple to traces on the printed circuit board.

71 Claims, 8 Drawing Sheets

U.S. PATENT DOCUMENTS

| | | | |
|---|---|---|---|
| 4,795,079 | 1/1989 | Yamada . | |
| 4,798,541 | 1/1989 | Porter | 439/67 |
| 4,850,892 | 7/1989 | Clayton et al. | 439/328 |
| 4,885,126 | 12/1989 | Polonio | 361/749 |
| 4,891,023 | 1/1990 | Lopata | 439/637 |
| 4,939,570 | 7/1990 | Bickford et al. | 257/735 |
| 4,967,262 | 10/1990 | Farnsworth | 257/696 |
| 4,975,763 | 12/1990 | Baudouin et al. . | |
| 5,002,494 | 3/1991 | Olsson | 439/77 |
| 5,026,297 | 6/1991 | Krehbiel . | |
| 5,051,366 | 9/1991 | Anderson et al. . | |
| 5,104,324 | 4/1992 | Grabbe et al. | 439/62 |
| 5,229,916 | 7/1993 | Frankeny et al. | 361/709 |
| 5,260,601 | 11/1993 | Baudouin et al. | 257/678 |
| 5,278,724 | 1/1994 | Angulas et al. | 439/67 |
| 5,337,220 | 8/1994 | Granitz . | |
| 5,432,678 | 7/1995 | Russell et al. | 361/760 |
| 5,568,363 | 10/1996 | Kitahara | 361/773 |
| 5,569,045 | 10/1996 | Hsu | 439/342 |
| 5,610,642 | 3/1997 | Nobel | 361/749 |
| 5,633,533 | 5/1997 | Andros et al. | 361/719 |
| 5,673,479 | 10/1997 | Hawthorne et al. | 361/760 |
| 5,748,209 | 5/1998 | Chapman et al. | 174/254 |
| 5,790,380 | 8/1998 | Frankeny | 174/254 |
| 5,903,292 | 5/1999 | Scheffelin et al. | 347/86 |

OTHER PUBLICATIONS

Choudhury, M. A. "Fasteners Take on New Shapes," Electronic Packaging & Production, pp. 58–59 (May 1986).

Goel, R. P. "Greater Packaging Density Through Direct Surface Mounting of Components," pp. 17–20 (Dec. 1986).

Janota, N. et al., "The Connectorization of Surface–Mount PC Boards," Design News, pp. 88–90 (Jun. 16, 1986).

Timmins, D. L. "An Elastomeric Interconnect System for Fine Pitch Leadless Chip Carriers," IEEE $34^{th}$ Electronic Components Conference, pp. 138–143 (May 14–16, 1984).

Gates, M., "Supporting the Surface Mounting Switchover," New electronics, pp. 63, 65, 67 (Jun. 26, 1984).

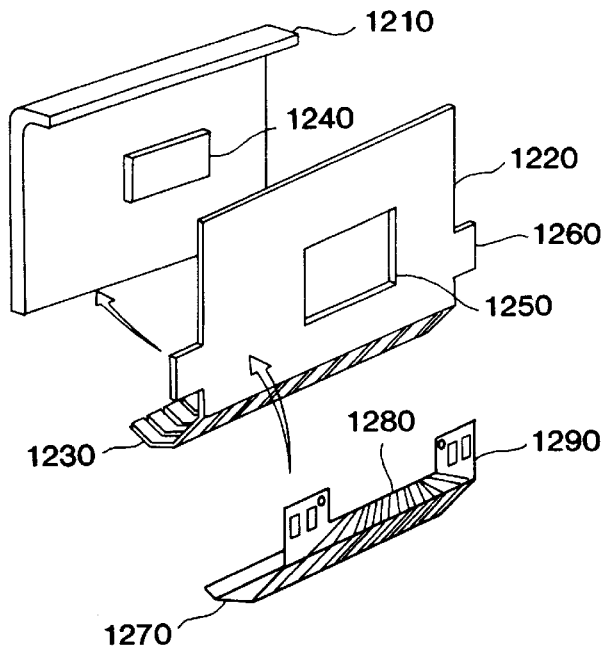
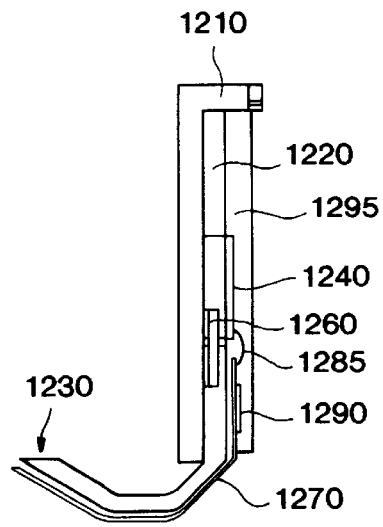
FIG. 12
FIG. 13
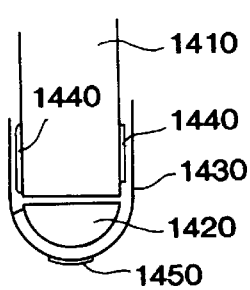
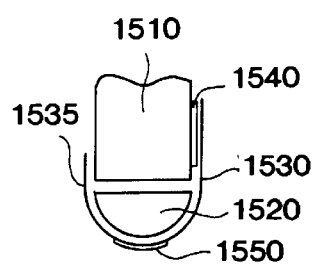
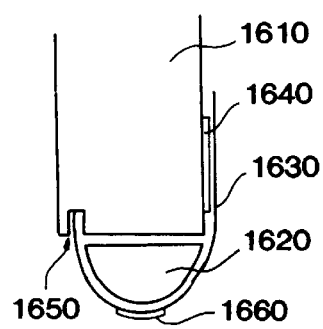
FIG. 14
FIG. 15
FIG. 16

INTEGRATED CIRCUIT PACKAGE FOR COUPLING TO A PRINTED CIRCUIT BOARD

FIELD OF THE INVENTION

The present invention relates to integrated circuit packages, and more specifically, to an improved vertical package for an integrated circuit.

BACKGROUND OF THE INVENTION

A semiconductor device is typically packaged as a chip and mounted on a circuit board to mechanically and electrically connect the semiconductor device to the circuit board. This allows the semiconductor device to be electrically coupled to various other devices within a digital data processing system.

One known package type is a surface vertical package ("SVP"), which provides for the edge-mounting of chips to circuit boards. The semiconductor device is packaged in a relatively flat package such that the leads that provide for electrical connections to the semiconductor device are positioned on one edge of the chip. Typically a semiconductor die containing an integrated circuit—which can be a semiconductor memory, processor, or ASIC, for example—resides in the center of a plastic package. Wires within the plastic package connect the semiconductor die with the leads, which reside on one end of the plastic package.

Each lead of the SVP chip is soldered to a respective solder pad on a circuit board to mechanically and electrically connect the semiconductor device to the circuit board. In the prior art, the leads of the SVP chip are bent substantially perpendicular relative to the SVP package so that the SVP chip is placed upright over the circuit board in soldering each lead to its respective solder pad. The SVP chip may have, at its bottom edge, supporting pins to help the SVP chip stand upright in soldering the SVP chip to the circuit board.

One problem with the prior SVP chip is that the electrical connection between the SVP chip and the circuit board is not of sufficiently high quality to handle extremely high frequencies and low voltage swings without electrical degradation.

Another disadvantage of the prior SVP chip is the difficulty in placing a large number of leads on one side of the SVP chip without having shorts between leads when the leads are soldered to the circuit board.

Another disadvantage of the prior SVP chip is that pressure applied to the SVP chip can lead to fractures in the leads, or short circuits, which in turn can lead to a loss of signal and a loss of data.

Another disadvantage of the prior SVP chip is the relative difficulty involved in installing and removing an SVP chip.

BRIEF SUMMARY OF THE INVENTION

One object of the present invention is to provide for a mechanical and electrical connection of a chip to a circuit board which that results in less pressure being applied to the leads of the chip.

Another object of the present invention is to provide for a heat spreader and pressure plate as part of the chip package.

Another object of the present invention is to provide an integrated ground plane for the chip package.

Another object of the present invention is to provide for the capability for users to mechanically and electrically couple and decouple chips from a circuit board with relative ease.

Another object of the present invention is to provide for a relatively low inductance connection in mechanically and electrically coupling chips to a circuit board.

A chip package is described. The chip package includes a base and an integrated circuit, or chip. The chip package further includes a flex circuit containing a plurality of traces. The flex circuit is coupled to the base, and extends from a bottom of the base. The flex-circuit has a substantially J-shaped form. The integrated circuit is coupled to the traces of the flex circuit, and the traces of the flex circuit are coupled to traces on a printed circuit board.

Another chip package is also described. The chip package includes a base which is substantially J shaped. A conforming flex circuit is coupled to the base. An integrated circuit is placed on the flex circuit, and the leads of the integrated circuit are coupled to the traces in the flex circuit. The traces of the flex circuit are coupled to traces on a printed circuit board.

Other objects, features, and advantages of the present invention will be apparent from the accompanying drawings and from the detailed description that follows below.

BRIEF DESCRIPTION OF THE DRAWINGS

The present invention is illustrated by way of example, and not by way of limitation, in the figures of the accompanying drawings and in which like reference numerals refer to similar elements and in which:

FIG. 12 is an exploded perspective view of another embodiment of the chip package wherein the base has an inverted L shape.

FIG. 13 is a side view of the chip package of FIG. 12.

FIG. 14 is a side view of an embodiment of the connecting portion of a chip package wherein both sides of the flex circuit are epoxied to the base.

FIG. 15 is a side view of another embodiment of the connecting portion of a chip package wherein only one side of the flex circuit is epoxied to the base.

FIG. 16 is a side view of another embodiment of the connecting portion of a chip package wherein one side of the flex circuit is disposed within a slot in the base.

DETAILED DESCRIPTION

A method and apparatus for an integrated circuit package is described.

Figure 1A:
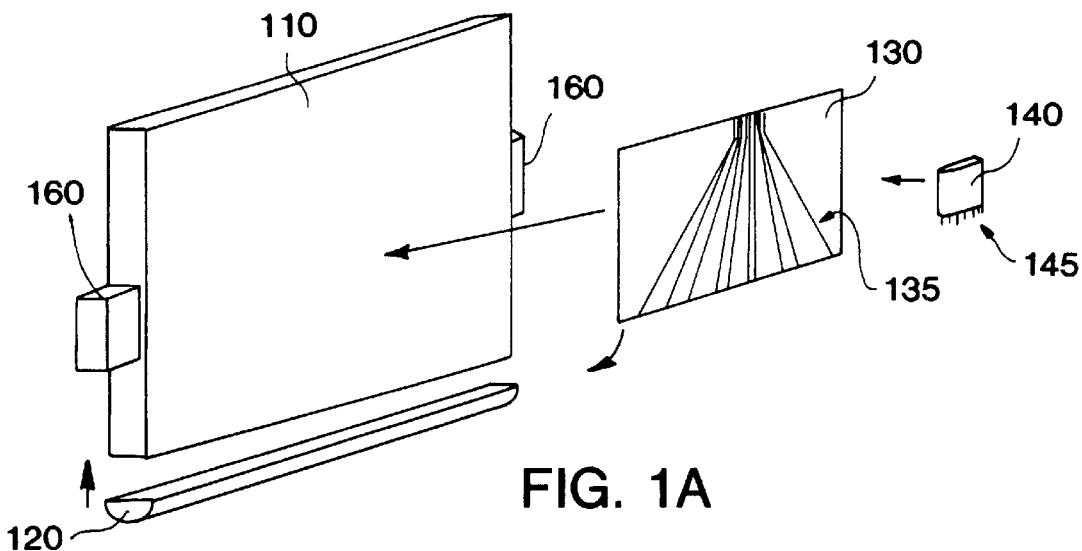
FIG. 1A is an exploded, perspective view of an embodiment of a chip package wherein the integrated circuit is epoxied to the base.

FIG. 1A is an exploded, perspective view of a chip package 100. A base 110 has a front, two sides, and a bottom. The bottom of the chip package 100 faces the printed circuit board. The base 110 acts as a heat spreader to dissipate heat generated by an integrated circuit 140. The base 110 further acts as a ground plane. Furthermore, the base 110 acts as a pressure plate. Depending on how the chip package 100 is physically mounted to the printed circuit board, there is considerable pressure between the chip package 100 and the printed circuit board. Base 110 helps to transfer pressure away from integrated circuit 140 and the leads of integrated circuit 140 and helps to transfer pressure to base 110. Because base 110 is not as fragile as integrated circuit 140, transferring the pressure in this way is advantageous.

The base 110 further has cam followers 160. The cam followers 160 are used to couple the chip package 100 to a printed circuit board. The cam followers 160 are located on the sides of the base 110. The cam followers 160 are offset from the center of the base. Offsetting the cam followers 160 from the center of the base by placing them closer to the contact area gives a longer levering arm. The longer levering arm makes it easier to place pressure on the chip package. This is advantageous because the chip package contacts the printed circuit board with 50–100 g/contact force. For a normal chip package having sixty leads, or contact points, the chip needs to have 50 g/contact*60 contacts=3000 g=3 kg=6.6 pounds of pressure.

For one embodiment, the cam followers 160 are part of the base 110, and molded from the same material in the same process as the base 110. For an alternate embodiment, the cam followers 160 are attached to the base 110 by epoxy, solder, or other means. For one embodiment, the base 110 and cam followers 160 are die cast. For one embodiment, the base 110 and cam followers 160 are made of zinc, brass, copper, or another metal. For an alternative embodiment, the base 110 is made of Alloy 42, which is 42% nickel and 56% iron. Alloy 42 reduces the thermal coefficient of expansion (TCE) to below 10, compared to approximately 15 for other materials. For alternative embodiments, base 110 is made of a material other than a metal or an alloy, such as plastic.

Figure 1B:
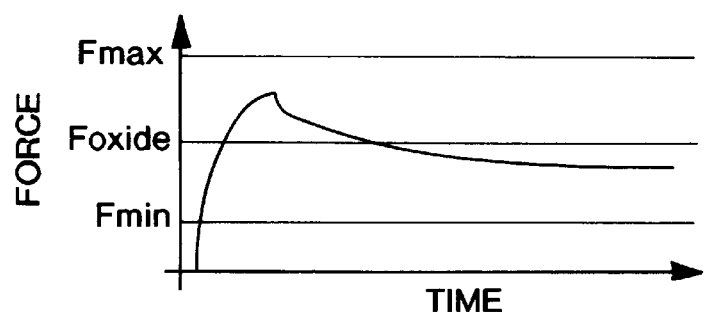
FIG. 1B is an illustration of a force diagram for an elastomer.

The chip package 100 of FIG. 1A further includes an elastomer 120 that is placed at the bottom of base 110. Elastomer 120 provides elasticity at the area of the chip package 100 that is in contact with a printed circuit board. For one embodiment, elastomer 120 has a substantially half-circle shape. For one embodiment, elastomer 120 is glued to the base 110 by epoxy. For one embodiment, the elastomer 120 is fluorosilicone, fluoroelastomer, silicone rubber, or a similar material. The elastomer 120 may be Fluorel manufactured by 3M Corporation or Viton manufactured by Du Pont de Nemours, E. I & Co., for example. The elastomer 120 has a compression set, which means that after a period of compression it no longer provides the same amount of force. Preferably, the elastomer has a compression set of less than 5%. For one embodiment, in order to counter the compression set of the elastomer 120, the initial force with which the chip package is coupled to a printed circuit board. The force diagram for an elastomer is illustrated in FIG. 1B.

Therefore, as time elapses, the force exerted by the elastomer 120 decreases. Stabilizing the elastomer reduces the compression set, and thereby flattens the force v. time curve. This permits less force to be used for the initial compression. For one embodiment, the elastomer is stabilized by heating.

Figure 1C:
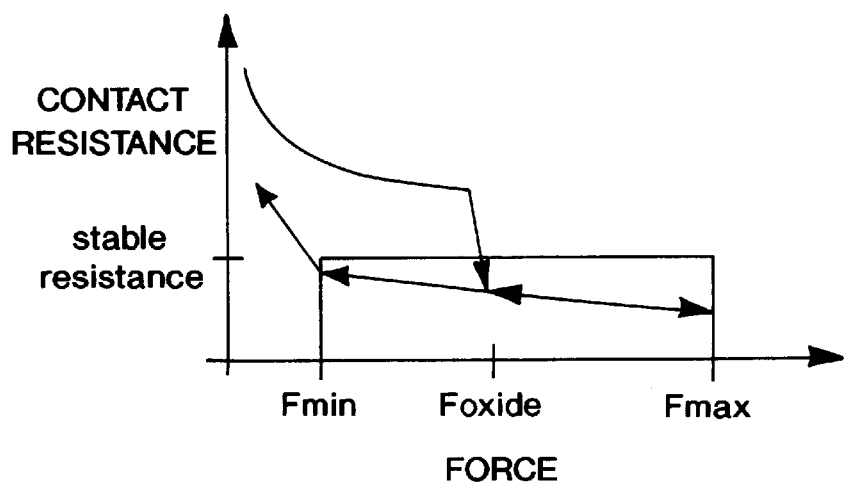
FIG. 1C is an illustration of the force needed for a stable contact resistance.

This has to be taken into consideration when determining the initial force applied to the elastomer 120 in order to have a stable contact resistance and therefore a good connection. The force needed for a stable contact resistance is illustrated in FIG. 1C.

Therefore, the initial force applied to the elastomer 120 has to be greater than the force needed to break the oxide layer and less than the maximum force which can be applied to the elastomer. The initial force has to be such that after compression set the force exerted by the elastomer is sufficient for the contact resistance to be in the stable area.

The chip package 100 of FIG. 1A further includes a flex circuit 130. The flex circuit 130 is a flexible material that includes a plurality of metallic traces or leads 135. For one embodiment, the traces 135 fan out on the flex circuit 130. That is, the traces 135 in the flex circuit 130 are closer together at one part of the flex circuit 130 than at another as shown in FIG. 1. For one embodiment, the flex circuit 130 is made of made of Kapton supplied by Du Pont de Nemours, E. I. & Co. For another embodiment, the flex circuit 130 is copper on polyimide. The flex circuit 130 is coupled to the base 110 by gluing flex circuit 130 with epoxy to the front of the base 110 and wrapping a portion of the flex circuit 130 around elastomer 120, which is at the bottom of base 110.

The chip package 100 of FIG. 1A is designed to receive an integrated circuit 140. For one embodiment, integrated circuit 140 has its leads 145 at the bottom of integrated circuit 140. For one embodiment, integrated circuit 140 is a dynamic random access memory (DRAM). For one embodiment, integrated circuit 140 is epoxied to flex circuit 130 and leads 145 of the integrated circuit 140 are soldered to traces 135 of the flex circuit 130. For an alternative embodiment, the integrated circuit 140 is epoxied to the base 110, and wire bonding is then used to connect the pads of integrated circuit 140 to the traces 135 of the flex circuit 130. For an alternative embodiment, the integrated circuit 140 is soldered to the base 110.

Figure 2:
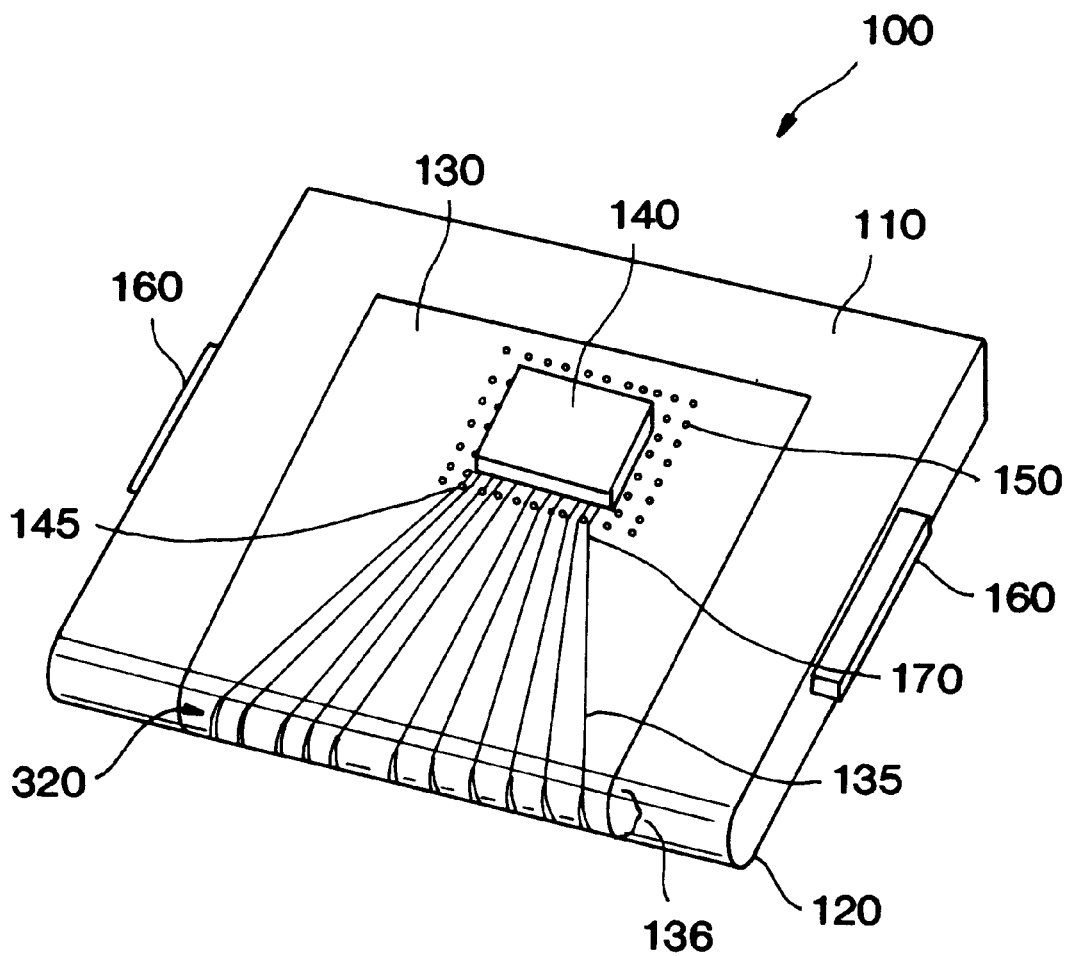
FIG. 2 is a perspective view of the a chip package of FIG. 1.

FIG. 2 is a perspective view of the chip package 100 of FIG. 1. Integrated circuit 140 is epoxied onto flex circuit 130. The leads 145 of the integrated circuit 140 are soldered to the traces 135 of the flex circuit 130 to provide an electrical connection between leads 145 and traces 135. The electrical connection between leads 145 of the integrated circuit 140 and traces 135 of the flex circuit 130 allows the electrical coupling of the integrated circuit 140 to a printed circuit board via traces 135 of the flex circuit 130. Traces 135 connect to the printed circuit board at the contact portion of the base 110 and the printed circuit board.

Flex circuit 130 further includes thermal vias 150. Thermal vias 150 transfer the heat energy generated by the integrated circuit 140 to the base 110. Base 110 acts as a heat spreader and heat dissipator.

Flex circuit 130 further includes ground connections 170. Ground connections 170 are holes in the flex circuit 130 through which specific traces of the flex circuit 130 are coupled to the base 110. Some of leads 145 are coupled to ground. This is accomplished by grounding the traces 135 that are coupled to the leads 145 that are to be grounded. Traces 135 are grounded by boring holes in the flex circuit 130, filling those holes with solder, and reflowing the solder in order to make ground connections 170. Base 110 thus acts as a ground plane.

Solder 320 is placed on the portion 136 of the traces 135 at the bottom of the base 110 and elastomer 120. The solder 320 over the portion 136 of the traces 135 helps maintain the curved shape of the portion 136 of the flex circuit 130 that curves around elastomer 120. The solder 320 on portion 136 of traces 135 also helps to provide a better electrical connection when chip package 100 is mounted on a printed circuit board.

Figure 3:
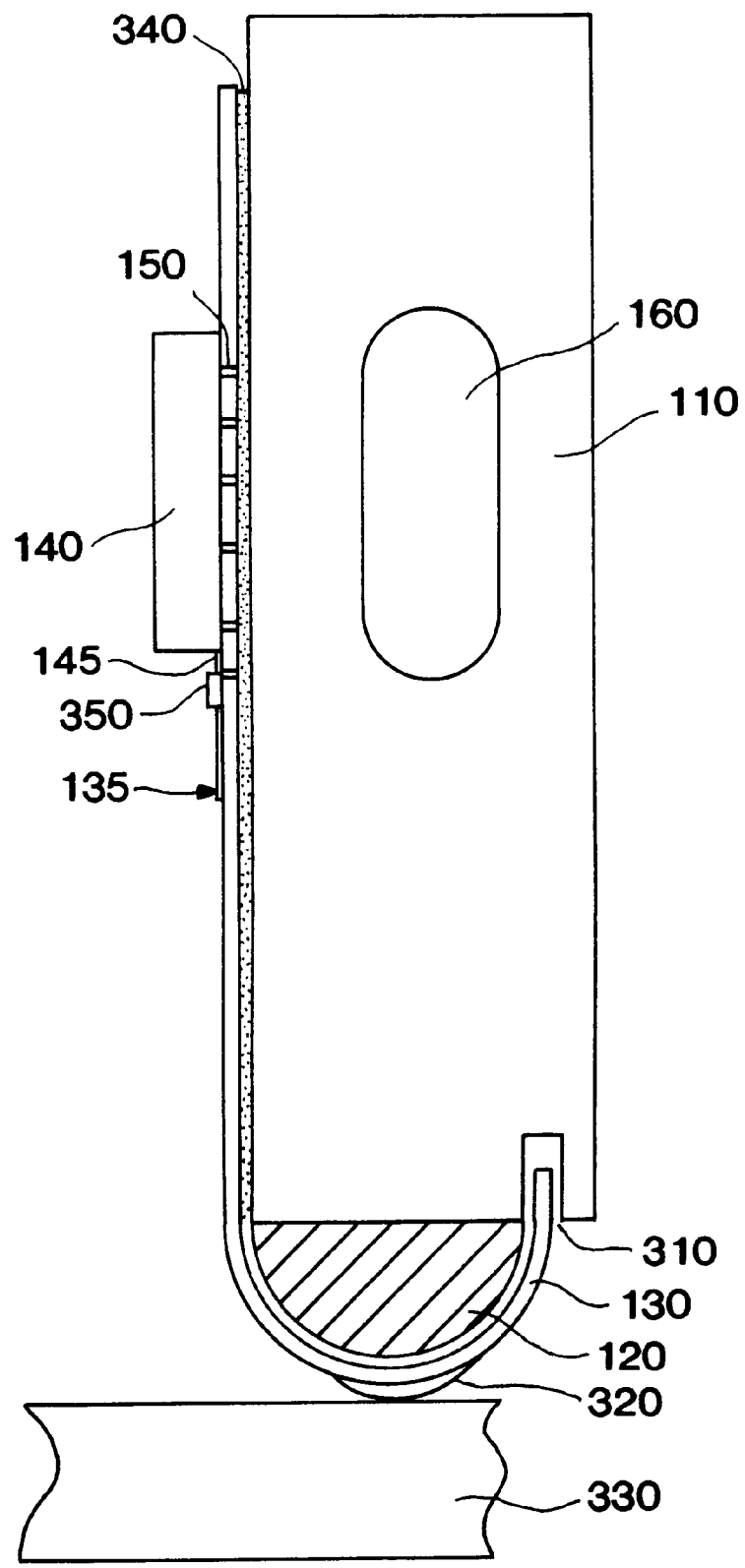
FIG. 3 is a side view of the chip package of FIG. 2.

FIG. 3 is a side view of the chip package of FIG. 1. This view includes a part of the printed circuit board 330. The chip package is coupled to the printed circuit board 330 via solder 320 on the traces 135 of the flex circuit 130. The solder 320 on the traces 135 provides the sole electrical contact with printed circuit board 330. This minimizes the contact area, which is advantageous because it allows for a large number of traces per unit of distance.

The flex circuit 130 is coupled to the base via a thin layer of epoxy 340. Flex circuit 130 is not glued down all the way however. The end of the flex circuit 130 not coupled to the integrated circuit is left loose. Thus, when the elastomer 120 is compressed by the pressure exerted on it by the chip package 100, the flex circuit does not wrinkle or bulge. For one embodiment, the end of the flex circuit 130 is disposed within a slot 310 in base 110. FIG. 3 further shows that leads 145 of the integrated circuit 140 are coupled with solder 350 to the traces 135 on the flex circuit 130.

Figure 4:
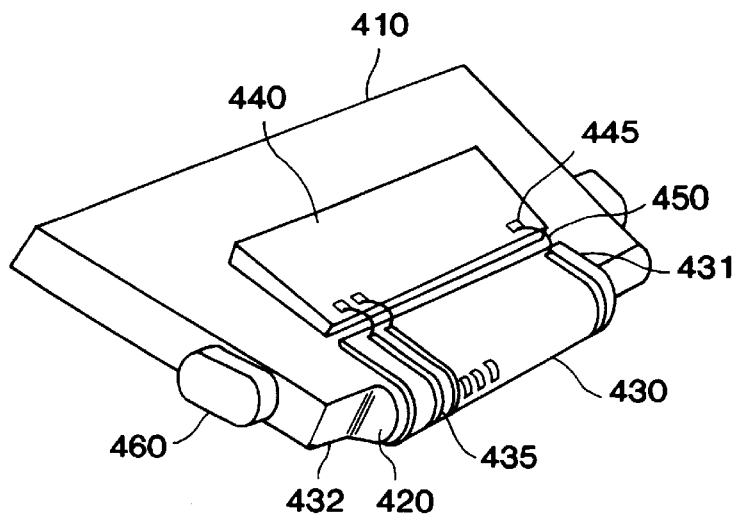
FIG. 4 is a perspective view of another embodiment of a chip package wherein the integrated circuit and the flex circuit are connected via bonding wires.

FIG. 4 is a perspective view of another embodiment of a chip package. The base 410 is similar to the base illustrated in FIG. 1. There are two cam followers 460 disposed on either side of the base 410. The integrated circuit 440 is glued to the base 410 using epoxy. An elastomer 420 is placed on the contact, or bottom, portion of the base 410. For one embodiment, elastomer 420 is glued to the base 410 using epoxy. Flex circuit 430 is then wrapped around elastomer 420. Upper portion 431 of flex circuit 430 is glued to base 410 using epoxy. For one embodiment, the other end 432 of flex circuit 430 is glued to the opposite side of base 410 using epoxy.

Flex circuit 430 has a plurality of traces 435. For one embodiment, the integrated circuit 440 has wire bond pads 445 as shown in FIG. 4. Alternatively, integrated circuit 440 may have leads. Flex circuit 430 also has wire bond pads on the traces 435. Bonding wires 450 are used to couple the wire bond pads 445 and the traces 435. For this embodiment, integrated circuit 440 and flex circuit 430 do not overlap. For an alternative embodiment, an some or all of integrated circuit 430 overlaps flex circuit 430.

Figure 5:
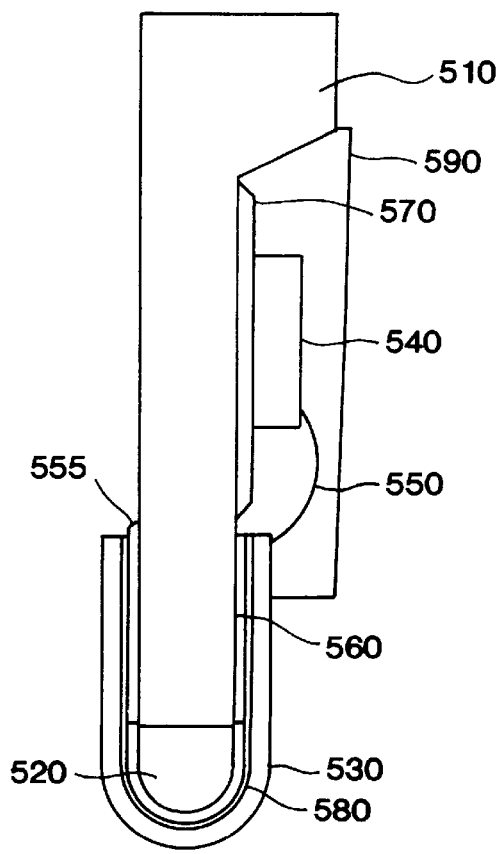
FIG. 5 is a side view of another embodiment of a chip package wherein a protective layer is placed between the flex circuit and the base.

FIG. 5 is a side view of another embodiment of a chip package. The base 510 has an overhanging top. Elastomer 520 is glued with epoxy to the bottom, or contact portion, of the base 510. A protective layer 580 is coupled to the base 510 via silver epoxy 555. Silver epoxy 555 acts as a heat and electricity transmitter. Protective layer 580 is a polyimide layer. Protective layer 580 has holes 560 in it. These holes 560 are filled with the silver epoxy 555, which is also used to couple the protective layer 580 to the base 510. The holes 560 are used to provide openings for ground contacts. As discussed above, some of the leads of an integrated circuit 540 need to be grounded, and this is accomplished using the holes 560.

A flex circuit 530 is coupled to the protective layer 580. Integrated circuit 540 is glued to the base 510 using an epoxy die attach 570. The integrated circuit 540 has a plurality of wire bond pads that are bonded to traces on the flex circuit 530 using bonding wires 450. The integrated circuit 540 and bonding wires 550 are covered with an encapsulation 590. The overhanging top of the base 510 is used as an edge for encapsulant 590. For one embodiment, the encapsulant 590 is epoxy.

Figure 6:
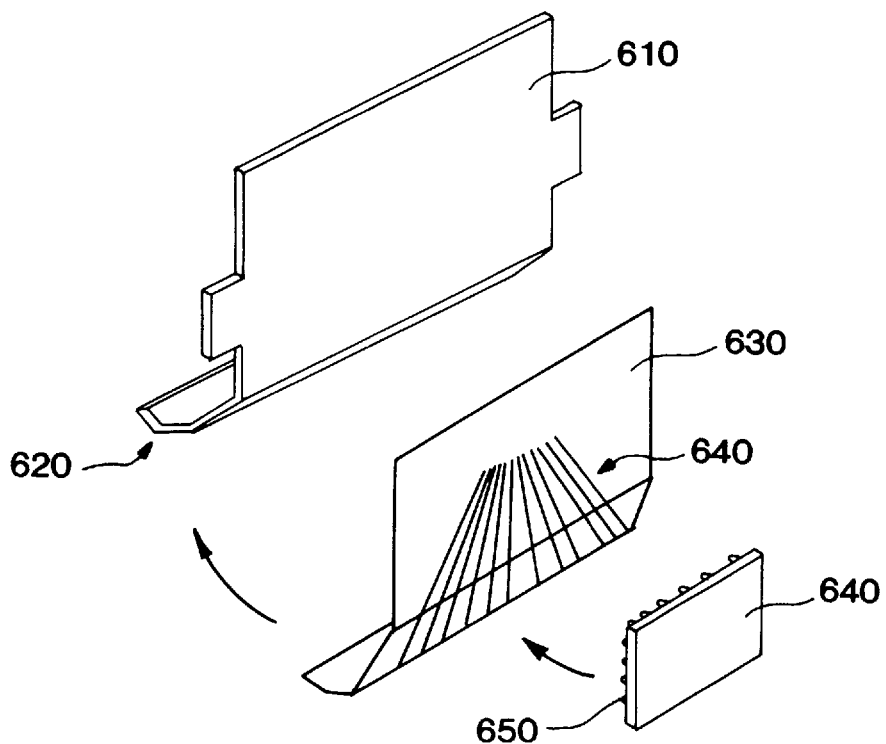
FIG. 6 is an exploded perspective view of another embodiment of a chip package wherein the base is J-shaped.

FIG. 6 is an exploded perspective view of another embodiment of a chip package. A base 610 is shown. The base has a substantially J-shaped body. The base 610 has a curved area 620, which provides elasticity. The base 610 is made of a metal which is flexible. For one embodiment, this metal is beryllium-copper ("BeCu"). A flex circuit 630 is coupled to the base 610. Flex circuit 630 is fastened to base 610 with epoxy. An integrated circuit 640 is placed on the flex circuit 630. The integrated circuit 640 is a ball grid array ("BGA") 650 type of circuit. The ball grid array 650 makes contact with traces 640 on the flex circuit 630. Ball grid array 650 is soldered to traces 640 on the flex circuit 630.

Figure 7:
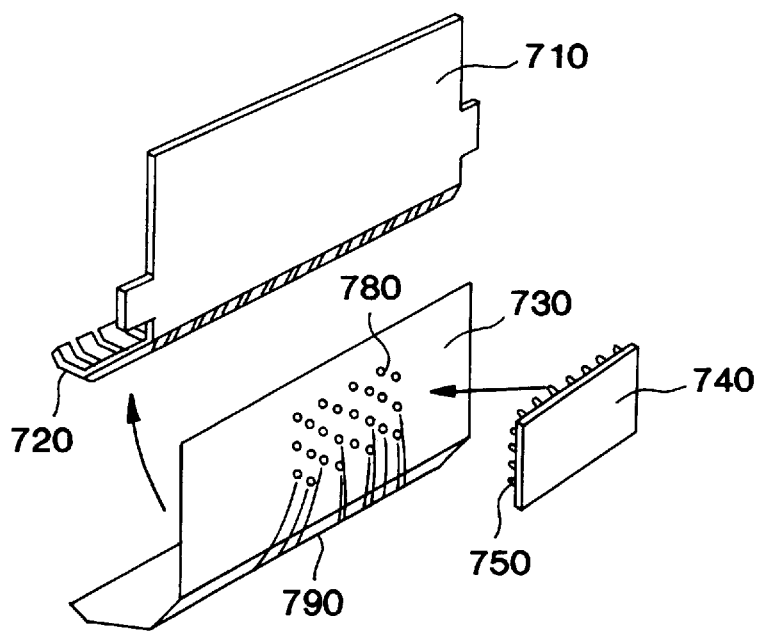
FIG. 7 is an exploded, perspective view of another embodiment of a chip package wherein the hook of the J shaped base has prongs.

FIG. 7 is an exploded, perspective view of another embodiment of a chip package. The base 710 is of a flexible metal such as BeCu. The base has a curved area 720, which is made of a plurality of prongs 720. The prongs 720 are substantially parallel and of equal size. The prongs 720 make the curved area of the base 710 more flexible. This reduces the pressure on the integrated circuit 740 coupled to the base 710. A flex circuit 730 is coupled to the base 710. The flex circuit 730 substantially conforms to the shape of the base 710. Flex circuit 730 does not have prongs, but is solid. An integrated circuit 740 with a ball grid array (BGA) 750 contact area is coupled to the flex circuit 730. For one embodiment, the coupling is accomplished by using solder between the BGA 750 and a plurality of pads 780 on the flex circuit 730. The flex circuit 730 also has a plurality of holes. These holes are used to ground those leads of the integrated circuit 740 that need to be coupled to ground. Ground traces are coupled to the base 710. For one embodiment the ground traces are coupled to the base 710 in two places—namely, near the printed circuit board to which the chip package is coupled and near the integrated circuit 740.

Figure 8:
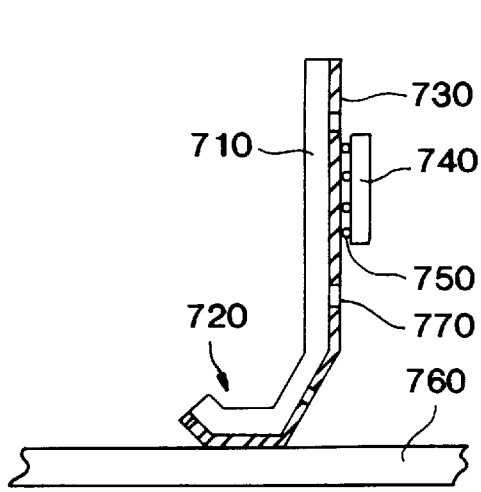
FIG. 8 is a side view of the chip package of FIG. 7.

FIG. 8 is a side view of the chip package of FIG. 7. The bottom of the curved area of the flex circuit 730 is coupled to a printed circuit board 760. The holes 770 in the flex circuit 730 are used to ground the ground traces of the flex circuit 730.

Figure 9:
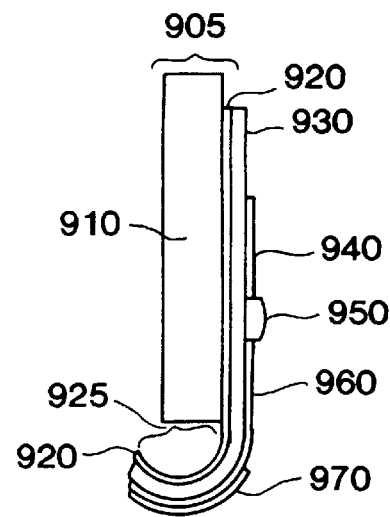
FIG. 9 is a side view of another embodiment of a chip package wherein a base is attached to a flexible J shaped metal.

FIG. 9 is a side view of another embodiment of a chip package. A flexible metal element 920 is attached to a supporting piece 910. The supporting piece 910 and flexible metal element 920 together form the base 905. The supporting piece 910 may include cam followers. The flexible metal element 920 has a J-shape. The shaft of the J is attached to the supporting piece 910. The hook of the J, or the spring element 925, extends beyond the bottom of the supporting piece 910. For one embodiment, the flexible metal element 920 is made of BeCu. For alternative embodiments, other conductive flexible metals may be used for the flexible metal element 920.

A thin protective layer 930 is attached to the flexible metal element 920. The protective layer 930 substantially follows the shape of the flexible metal element 920. Protective layer 930 is a polyimide layer. An integrated circuit 940 is placed on the protective layer 930. Below the integrated circuit 940, a flex circuit 960 is placed on the protective layer 930. The flex circuit 960 has a plurality of traces. Integrated circuit 940 has a plurality of bonding wires 950 connect the wire bond pads of integrated circuit 940 to the traces in the flex circuit 960. At the contact portion of the chip package, a conductive plating 970 is coupled to the traces of the flex circuit 960. This conductive plating 970 is made of tin-lead (PbSn), gold (Au), or palladium-nickel (PdNi), for example.

Figure 10:
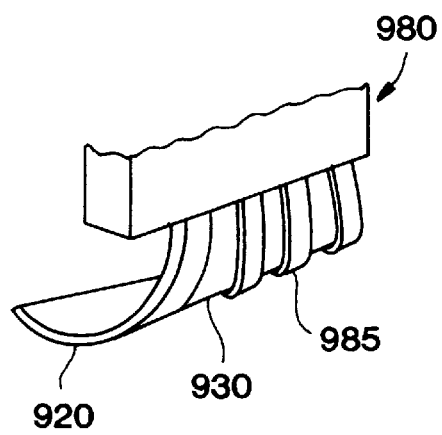
FIG. 10 is a perspective view of part of the chip package of FIG. 9.

FIG. 10 is a perspective view of a contact portion of the chip package of FIG. 9. The flexible metal element 920 is curved and provides flexibility and contact normal force. Flexible metal element 920 acts as a ground plane as well. The protective layer 930 provides insulation between the flexible metal element 920 and a plurality of metal traces 985. Metal traces 985 are part of the flex circuit 930. When chip package 980 is connected to a printed circuit board, the metal traces 985 contact metal traces on the printed circuit board, providing an electrical connection between chip package 980 and the printed circuit board. Metal traces 985 are made of copper. For one embodiment, the bottom of the metal traces 985 are covered with conductive plating.

Figure 11:
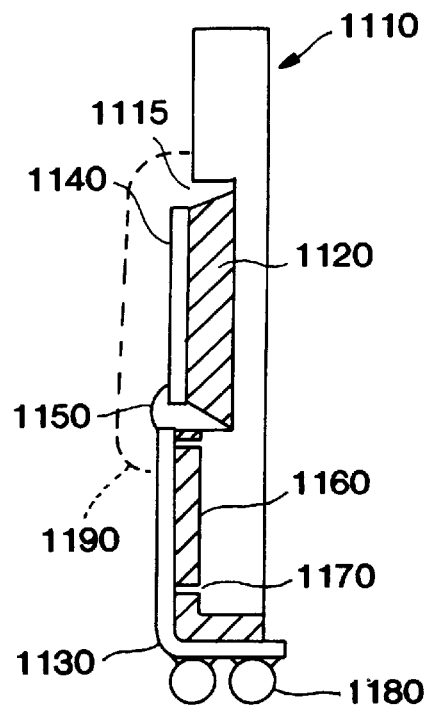
FIG. 11 is a side view of another embodiment of the chip package wherein chip package is a BGA type chip package.

FIG. 11 is a side view of another embodiment of the chip package. A base 1110 is shaped with a depression 1115 in the side. An integrated circuit 1140 is epoxied to the base 1110. Integrated circuit 1140 resides in the depression 1115 in the base 1110. For one embodiment, depression 1115 is shaped such that the integrated circuit 1140 fits in the depression 1115 with only a small clearance between the integrated circuit 1140 and the edge of the depression 1115.

A flex circuit 1130 is glued to the base 1110 below the depression 1115 using epoxy 1160. Traces on the flex circuit 1130 are coupled to leads or wire bond pads on the integrated circuit 1140 using bonding wire 1150. There are a number of holes 1170 in the adhesion material 1160. These holes 1170 are filled with solder or similar conductive material to couple ground traces in the flex circuit 1130 to the base 1110, which acts as a ground plane. At the bottom, a plurality of solder balls 1180 are coupled to the traces of the flex circuit 1130. These solder balls 1180 are used to contact traces on a printed circuit board. The integrated circuit 1140 and bonding wires 1150 are covered by a layer of encapsulant 1190. The encapsulant 1190 is designed to protect the integrated circuit 1140 from dirt and other materials that could interfere with the functioning of integrated circuit 1140. For one embodiment, the encapsulant 1190 is epoxy.

FIG. 12 is an exploded perspective view of another embodiment of the chip package. A base 1210 has a top, a side, and a bottom. The base 1210 has an overhanging top. Base 1210 is shaped like an inverted L. Base 1210 is made of copper, or alloy 42. For alternative embodiments, base 1210 is made of other metals. For alternative embodiments, base 1210 is made of materials other than metal, such as plastic. Integrated circuit 1240 has wire bonding pads, and is epoxied to the base 1210.

A flexible metal layer 1220 is coupled to the base 1210. The flexible metal layer 1220 has a contact spring element 1230. The contact spring element 1230 provides flexibility. Contact spring element 1230 is made up of a plurality of parallel prongs. Flexible metal layer 1220 is made of BeCu, or phosphor bronze. The flexible metal layer 1220 also has a hole 1250. The hole 1250 is designed such that when the flexible metal layer 1220 is attached to the base 1210, the integrated circuit 1240 attached to the base 1210 projects through the hole 1250 in the flexible metal layer 1220. Furthermore, the flexible metal layer 1220 includes locking tabs 1260. The locking tabs 1260 are designed to mate with a support rail into which the chip package is placed. The locking tabs 1260 are designed to hold the chip package in contact with the printed circuit board.

A flex circuit 1270 is coupled to the flexible metal layer 1220. The flex circuit 1270 is shaped to parallel the shape of the flexible metal layer 1220. For one embodiment, the flex circuit 1270 is designed with a U shape, the two prongs of the U shape extending on either side of the hole 1250 in the flexible metal layer 1220. At the bottom of the U shape, there are a plurality of wire bond pads 1280. The wire bond pads 1280 are connected to traces in the flex circuit. The traces are fan out from the wire bond pads 1280. The flex circuit further includes locations for bypass capacitors 1290.

FIG. 13 is a side view of the chip package of FIG. 12. The integrated circuit package 1240, attached to the base 1210, extends from the base 1210, through the flexible metal layer 1220. The flex circuit 1270 is approximately at the same level as the integrated circuit 1240. The leads or wire bond pads on the integrated circuit 1240 are connected to the wire bond pads on the flex circuit 1270 via bonding wires 1285. An encapsulation layer 1295 made of epoxy covers the integrated circuit 1240, the bonding wires 1285, the wire bond pads on the flex circuit 1270.

FIG. 14 is a side view of the connecting portion of a chip package. An elastomer 1420 is attached to the bottom of the base 1410. For one embodiment, the elastomer 1420 is fluorosilicone, silicone rubber, fluoroelastomer, or a similar material. A flex circuit 1430 is wrapped around the base 1410 and the elastomer 1420. Flex circuit 1430 is attached to the base 1410 with an adhesive 1440 at both sides of the base 1410. Flex circuit 1430 may also be attached to the elastomer 1420 using epoxy. The contact portion of the flex circuit 1430 is coated with a conductive material 1450. For one embodiment, conductive material 1450 is solder. The conductive material 1450 is designed to minimize the surface area that is in contact with a printed circuit board.

FIG. 15 is a side view of another embodiment of the connecting portion of a chip package. Elastomer 1520 is attached to the base 1510. A flex circuit 1530 is wrapped around the base 1510 and the elastomer 1520. The flex circuit 1530 is attached to the base 1510 at one side with an adhesive 1540 such as epoxy. The other end of the flex circuit 1530 is not attached to the base 1510. Thus, when the elastomer 1520 is compressed when the chip package is coupled to a printed circuit board, the flex circuit 1530 does not buckle, because it can adjust. The contact portion of the flex circuit 1530 is coated with solder 1550. Solder 1550 helps flex circuit 1530 maintain its curved shape around elastomer 1520. Solder 1550 is also used to connect to the metallic traces on a printed circuit board.

FIG. 16 is a side view of another embodiment of the connecting portion of a chip package. There is a slot 1650 in the bottom of the base 1610. An elastomer 1620 is attached to the base. Elastomer 1620 does not, however, cover the slot 1650. A flex circuit 1630 is wrapped around the base 1610 and the elastomer 1620. One end of the flex circuit 1630 is loosely inserted into the slot 1650. The flex circuit 1630 is attached to the base 1610 at one side with an adhesive 1640 such as epoxy. The other end of the flex circuit 1630 resides in slot 1650. Thus, when the elastomer 1620 is compressed when the chip package is coupled to a printed circuit board, the flex circuit 1630 does not buckle, because flex circuit 1630 can adjust. The contact portion of the flex circuit 1630 is coated with a conductive material 1670, such as solder.

Figure 17:
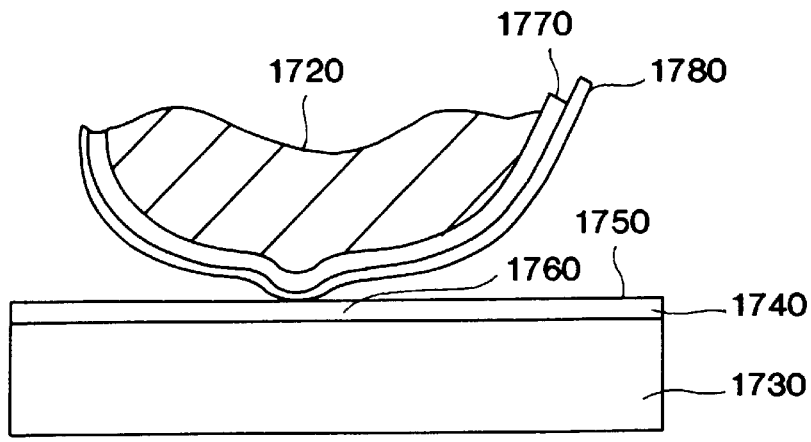
FIG. 17 is a side view of another embodiment of the connecting portion of a chip package wherein a bump is shaped at the contact portion of the flex circuit.

FIG. 17 is a side view of another embodiment of the connecting portion of a chip package. A chip package includes an elastomer 1720. A protective layer 1770 is coupled to the elastomer 1720. A flex circuit 1780 is placed over the protective layer 1770. The flex circuit 1780 includes a plurality of traces. The traces are made of copper foil, and are covered with a PbSn plate. The flex circuit 1780 is coupled to a printed circuit board 1730. The printed circuit board also has a plurality of traces 1740. The traces 1740 are covered by a PbSn plate. Thus, the PbSn plated traces of the flex circuit 1780 are in contact with the PbSn plated traces of the printed circuit board 1730. The chip package further has a bump 1760 in the contact area. This bump 1760 is designed to minimize the contact area of the chip package and the printed circuit board 1730. Alternatively, such a bump is added to the traces in the flex circuit 1780 by the PbSn plate.

Figure 18:
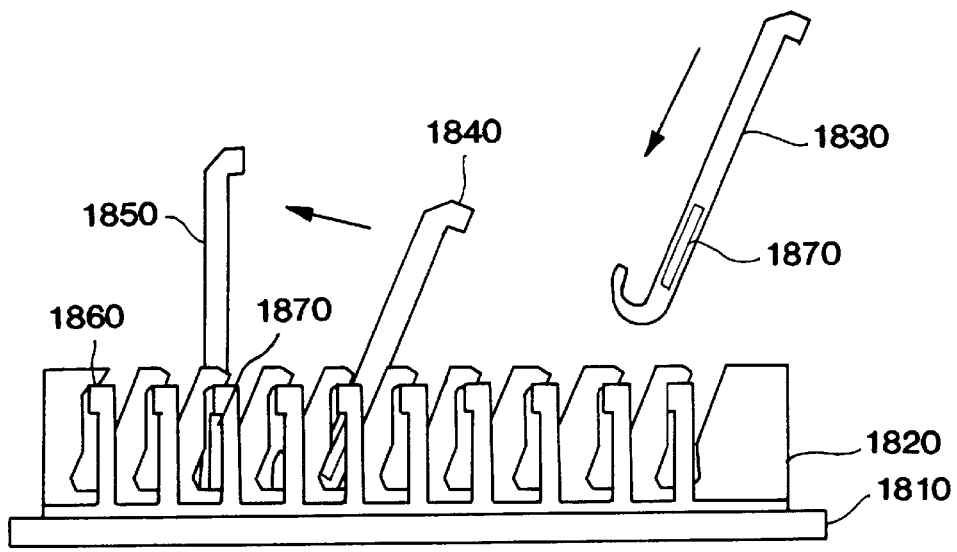
FIG. 18 is a side view of an embodiment of a mounting mechanism of a chip package wherein a J-shaped chip package can be mounted.

FIG. 18 is a side view of an embodiment of a mechanism in which the chip package may be inserted. A step by step demonstration of the mounting of the chip carrier on to a printed circuit board 1810 is shown. Two substantially parallel board mounted support rails 1820 are mounted to the printed circuit board 1810. The support rails 1820 are coupled to the printed circuit board 1810 by screws, an adhesive, or other means. The support rails are shaped to accept a chip package and hold it in place. For one embodiment, the support rails engage the cam followers 1870 of the chip package, and push the contacts of the chip package against traces on the printed circuit board 1810.

The printed circuit board 1810 further includes two substantially parallel board mounted rails of latches. A set of latches 1860 is associated with each support rail pair 1820. The latches 1860 keep the chip package in place, once the chip package is inserted into the support rails 1820. For one embodiment, the latches 1860 are molded plastic having a wedge shaped head, which is oriented to enable the chip packages to be inserted with ease and then hold the chip package against backward force.

The first chip package 1830 illustrated is being inserted into the support rail. The chip package 1830 is inserted at an angle. For one embodiment, that angle is approximately 10–15 degrees. When the chip package 1830 has made contact with the printed circuit board 1810, no further downward force is asserted.

The second chip package 1840 is being turned in the support rail. After an initial rotation the chip package 1840 makes contact with the printed circuit board. The chip package 1840 is rotated further to a substantially vertical position. The act of rotation wipes the contacts at the contact area of the chip package 1840. This wiping clears the contacts of surface film and debris, breaks the oxide barrier, and helps to ensure a better contact. For one embodiment, after an initial 5 degree rotation, the contacts are engaged, and the remaining 10 degrees of rotation is performs the wiping action.

The third chip package 1850 is illustrated in its vertical position. The chip package is supported by the support rail 1820 and is latched by the latches 1860. The chip package 1850 is held with a force of approximately 50–100 g/contact. The mounting mechanism shown is field replaceable, and supports the chip package 1850 in a vertically mounted position.

Figure 19:
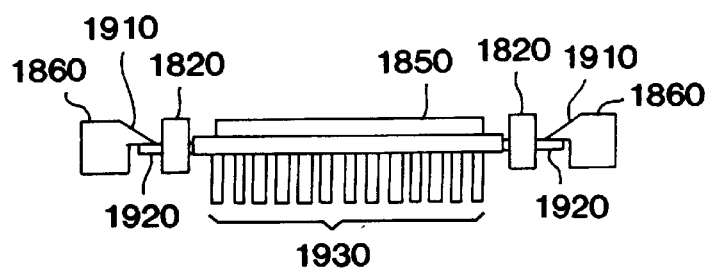
FIG. 19 is a top view of one J-shaped chip package in the mounting mechanism of FIG. 18.

FIG. 19 is a top view of one chip package in the mounting mechanism of FIG. 18. The chip package 1850 is inserted between the support rails 1820. The support rails 1820 are substantially parallel and each engage one of the cam followers 1920 of the chip package 1850. The contacts 1930 of the chip package 1850 is in contact with the printed circuit board (not shown). The latches 1860 support the chip package 1850 and prevent it from slipping. The latches 1860 have a wedge shaped head 1910, which permits easy movement only in one direction. The chip package 1850 can be removed, but greater force has to be exerted. The force which the chip package 1850 exerts is not sufficient to move the latches 1860.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. An integrated circuit (IC) package for coupling to a printed circuit board, the IC package comprising:
    a base having a side and a bottom;
    a flex circuit coupled to the base wrapping around a portion of the side and the bottom of the base, and conforming to the base, the flex circuit having traces;
    the traces on the flex circuit configured to be coupled to a plurality of leads of an integrated circuit, and the traces on the flex circuit further for coupling the IC package to the printed circuit board at the bottom of the base; and
    the IC package configured to be coupled to the printed circuit board by engaging the printed circuit board with the base at an insertion angle with respect to the printed circuit board and rotating the base to a mounting angle with respect to the printed circuit board.

2. The integrated circuit package of claim 1 further comprising an elastomer coupled to the bottom of the base, the flex circuit contacting the elastomer.

3. The integrated circuit package of claim 2, wherein said elastomer has a compression set of less than 5%.

4. The integrated circuit package of claim 3 wherein another end of the flex circuit is glued to the base.

5. The integrated circuit package of claim 2 further comprising a slot in the base, the slot in the base receiving one end of the flex circuit.

6. The integrated circuit package of claim 2 wherein both ends of the flex circuit are glued to the base.

7. The integrated circuit package of claim 6 wherein said flex circuit is attached to the side of the base with a silver epoxy.

8. The integrated circuit package of claim 1 further comprising epoxy die attach, attaching the IC to the base.

9. The integrated circuit package of claim 1 wherein the traces on the flex circuit are fanned out between where the leads of the IC are coupled and where the integrated circuit package is coupled to the printed circuit board.

10. The integrated circuit package of claim 1 further comprising a solder on the traces of the flex circuit, the solder contacting the printed circuit board.

11. The integrated circuit package of claim 1 wherein the plurality of leads of the IC are soldered to the traces on the flex circuit.

12. The integrated circuit package of claim 1 wherein the plurality of leads of the IC are coupled via bonding wire to the traces on the flex circuit.

13. The integrated circuit package of claim 1 wherein the plurality of leads of the IC are a ball grid array, and the ball grid array is soldered to the traces on the flex circuit.

14. The integrated circuit package of claim 1 further comprising holes in the flex circuit, the holes for contacting ground wires to the base, the base acting as a ground plane.

15. The integrated circuit package of claim 1 further comprising encapsulation, encapsulating the IC.

16. The integrated circuit package of claim 15, wherein the encapsulation encapsulates the IC and the plurality of leads of the IC coupled to traces on the flex circuit.

17. The integrated circuit package of claim 1, further comprising a cam follower attached to the base, the cam follower for attaching the integrated circuit package into a chip file.

18. The integrated circuit package of claim 17, wherein said cam follower is integrally formed with the base.

19. The integrated circuit package of claim 1, wherein the base is made of zinc.

20. The integrated circuit package of claim 19, wherein the base is stamped.

21. The integrated circuit package of claim 1, wherein the base acts as a pressure plate and a heat spreader.

22. The integrated circuit page of claim 21, wherein the base further acts as a ground plane.

23. The integrated circuit package of claim 1, wherein the base is shaped like a J, the side of the base being a shaft of the J, and the bottom being a hook of the J.

24. The integrated circuit package of claim 23, wherein the hook of the J comprises a plurality of substantially parallel fingers.

25. The integrated circuit package of claim 23, wherein the base is made of a flexible metal.

26. The integrated circuit package of claim 25, wherein the base is made of BeCu.

27. The integrated circuit package of claim 1, further comprising a thin flexible layer coupled to the side of the base, and extending beyond the side of the base.

28. The integrated circuit package of claim 27, wherein the thin flexible layer comprises a thin metal layer and a thin insulating layer, the thin metal layer coupled to the base, and the thin insulating layer coupled to the flex circuit.

29. The integrated circuit package of claim 28 wherein the thin metal layer is made of BeCu.

30. The integrated circuit package of claim 28, wherein the thin insulating layer is a polyimide layer.

31. The integrated circuit package of claim 27, wherein said thin flexible layer forms a J shape, a shaft of the J attached to the base, and a hook of the J extending beyond the base and the hook of the J for coupling the integrated circuit package to the printed circuit board.

32. The integrated circuit package of claim 27, further comprising a conductive plate coupled to the traces of the flex circuit, the conductive plate contacting the printed circuit board.

33. The integrated circuit package of claim 1, further comprising a plurality of solder balls, the solder balls coupled to the traces of the flex circuit, the solder balls for coupling the integrated circuit package to the printed circuit board.

34. The integrated circuit package of claim 1, further comprising a bump in the flex circuit, the bump designed to reduce an area of contact between the integrated circuit package and the printed circuit board.

35. The integrated circuit package of claim 34, further comprising a conductive plate coupled to the traces on the flex circuit, for contacting a plate on the printed circuit board.

36. The integrated circuit package of claim 35, wherein the conductive plate is PbSn.

37. The package of claim 1 wherein the insertion angle is approximately 10–15 degrees from perpendicular to the printed circuit board.

38. The package of claim 1 wherein the mounting angle is about 90 degrees.

39. The package of claim 1 wherein the traces of the flex circuit for coupling the IC package to the printed circuit board are wiped during rotation of the base to the mounting angle.

40. An integrated circuit (IC) package for coupling an integrated circuit (IC) to a printed circuit board, the IC package comprising:

a base having a side and a bottom;
an elastomer having a curved shape coupled to the bottom of the base;
a flex circuit coupled to the base and the elastomer, and conforming to the base and the elastomer;
the IC coupled to the side of the base, and having leads, the leads of the IC coupled to traces on the flex circuit; and
the traces on the flex circuit coupled to traces on the printed circuit board, such that the IC package is coupled to the printed circuit board by engaging the printed circuit board with the base at an insertion angle with respect to the printed circuit board and rotating the base to a mounting angle with respect to the printed circuit board.

41. The integrated circuit package of claim 40 further comprising cam followers attached to the base, to fix the integrated circuit package to the printed circuit board.

42. The integrated circuit package of claim 40 further comprising solder coupled to the traces on the flex circuit, to provide point contacts with the traces on the printed circuit board.

43. The integrated circuit package of claim 42, wherein the point contacts are wiped when the integrated circuit package is inserted into a mounting mechanism.

44. The integrated circuit package of claim 40 wherein the base is made of approximately 42% nickel and 58% iron.

45. The integrated circuit package of claim 40 wherein the flex circuit is copper on polyimide.

46. The integrated circuit package of claim 40, wherein the elastomer is selected from the group of: fluorosilicon, silicon rubber or fluoroelastomer.

47. The integrated circuit package of claim 40, wherein the IC is a dynamic random access memory (DRAM).

48. The package of claim 40 wherein the insertion angle is approximately 10–15 degrees from perpendicular to the printed circuit board.

49. The package of claim 40 wherein the mounting angle is about 90 degrees.

50. The package of claim 40 wherein the traces of the flex circuit for coupling the IC package to the printed circuit board are wiped during rotation of the base to the mounting angle.

51. An integrated circuit (IC) package for coupling an integrated circuit to a printed circuit board, comprising:

a base having a bottom, a side, a first layer capable of having the integrated circuit coupled to it, and a second layer coupled to the first layer;
a flex circuit having traces therein, the flex circuit coupled to the base;
the IC package configured to be coupled to the printed circuit board by engaging the printed circuit board with the base at an insertion angle with respect to the printed circuit board and rotating the base to a mounting angle with respect to the printed circuit board; and the traces for coupling to leads of the integrated circuit, and the traces further for coupling to traces on the printed circuit board.

52. The integrated circuit package of claim 50, wherein the first layer of the base is in the shape of an inverted L.

53. The integrated circuit package of claim 50, wherein the second layer of the base is in the shape of a J, a hook of the J extending beyond a bottom of the first layer.

54. The integrated circuit package of claim 53, wherein the hook of the J of the second layer comprises a plurality of substantially parallel prongs.

55. The integrated circuit package of claim 53, wherein the second layer of the base has a hole in it, the hole being substantially equal in size to a size of the integrated circuit, and the integrated circuit projecting through the hole in the second layer.

56. The integrated circuit package of claim 53 further comprising locking tabs, the locking tabs for interacting with a mounting mechanism of the printed circuit board, for fastening the integrated circuit package on the printed circuit board.

57. The integrated circuit package of claim 53, wherein the flex circuit is substantially conforming with hook of the J.

58. The integrated circuit package of claim 57, wherein the flex circuit further comprises a plurality of wire bond pads, the wire bond pads for coupling to the integrated circuit.

59. The integrated circuit package of claim 58, wherein the traces of the flex circuit are coupled via bonding wire to the leads of the integrated circuit.

60. The integrated circuit package of claim 50, wherein the flex circuit is in the shape of a U, and the flex circuit is coupled to the second layer of the base.

61. The integrated circuit package of claim 51, further comprising a location for a bypass capacitor on the flex circuit.

62. The integrated circuit package of claim 50 wherein the first layer is made of copper.

63. The integrated circuit package of claim 50 the first layer is made of approximately 42% nickel and 58% iron.

64. The integrated circuit package of claim 50 wherein the second layer is made of a flexible metal.

65. The integrated circuit package of claim 64 wherein the second layer is made of BeCu.

66. The integrated circuit package of claim 50 wherein the flex circuit is copper on polyimide.

67. The integrated circuit package of claim 50 further comprising an encapsulation for protecting the integrated circuit and a bonding wire coupling the integrated circuit and the traces on the flex circuit.

68. The integrated circuit package of claim 67, wherein the encapsulant is epoxy.

69. The package of claim 51 wherein the insertion angle is approximately 10–15 degrees from perpendicular to the printed circuit board.

70. The package of claim 51 wherein the mounting angle is about 90 degrees.

71. The package of claim 51 wherein the traces of the flex circuit for coupling the IC package to the printed circuit board are wiped during rotation of the base to the mounting angle.

* * * * *